United States Patent
Yoshikawa et al.

(10) Patent No.: US 8,475,978 B2
(45) Date of Patent: Jul. 2, 2013

(54) PHOTOMASK BLANK AND MAKING METHOD, PHOTOMASK, LIGHT PATTERN EXPOSURE METHOD, AND DESIGN METHOD OF TRANSITION METAL/SILICON BASE MATERIAL FILM

(75) Inventors: Hiroki Yoshikawa, Joetsu (JP); Yukio Inazuki, Joetsu (JP); Ryuji Koitabashi, Joetsu (JP); Hideo Kaneko, Joetsu (JP); Takashi Haraguchi, Tokyo (JP); Yosuke Kojima, Tokyo (JP); Tomohito Hirose, Tokyo (JP)

(73) Assignees: Shin-Etsu Chemical Co., Ltd., Tokyo (JP); Toppan Printing Co., Ltd., Tokyo (JP)

( * ) Notice: Subject to any disclaimer, the term of this patent is extended or adjusted under 35 U.S.C. 154(b) by 117 days.

(21) Appl. No.: 13/228,501

(22) Filed: Sep. 9, 2011

(65) Prior Publication Data

US 2012/0064438 A1    Mar. 15, 2012

(30) Foreign Application Priority Data

Sep. 10, 2010 (JP) .................. 2010-203252

(51) Int. Cl.
G03F 1/22 (2012.01)
G03F 1/24 (2012.01)

(52) U.S. Cl.
USPC .......................................................... 430/5

(58) Field of Classification Search
USPC ......... 430/5, 322, 323, 324; 378/35; 428/428, 428/432
See application file for complete search history.

(56) References Cited

U.S. PATENT DOCUMENTS

| 5,474,864 A | 12/1995 | Isao et al. |
| 7,179,545 B2 | 2/2007 | Okazaki et al. |
| 7,691,546 B2 | 4/2010 | Yoshikawa et al. |
| 7,771,893 B2 | 8/2010 | Yoshikawa et al. |
| 7,941,767 B2 | 5/2011 | Mukai et al. |
| 2010/0167185 A1 | 7/2010 | Suzuki et al. |

FOREIGN PATENT DOCUMENTS

| DE | 10 2009 060 677 A1 | 8/2010 |
| EP | 1 801 647 A1 | 6/2007 |
| JP | 7-140635 A | 6/1995 |
| JP | 7-181664 A | 7/1995 |
| JP | 10-171096 A | 6/1998 |
| JP | 2004-133029 A | 4/2004 |
| JP | 2006-78807 A | 3/2006 |
| JP | 2007-33470 A | 2/2007 |
| JP | 2008-276002 A | 11/2008 |
| JP | 2010-156880 A | 7/2010 |
| KR | 10-2010-0080413 A | 7/2010 |

OTHER PUBLICATIONS

Faure et al., "Characterization of Binary and Attenuated Phase Shift Mask Blanks for 32nm Mask Fabrication", Proc. of SPIE, vol. 7122, pp. 712209-1-712209-12 (2008).

*Primary Examiner* — Stephen Rosasco
(74) *Attorney, Agent, or Firm* — Birch, Stewart, Kolasch & Birch, LLP

(57) ABSTRACT

A photomask blank has a film of a transition metal/silicon base material comprising a transition metal, silicon, oxygen and nitrogen, having an oxygen content of at least 3 atom %, and satisfying the formula: $4 \times C_{Si}/100 - 6 \times C_M/100 > 1$ wherein $C_{Si}$ is a silicon content in atom % and $C_M$ is a transition metal content in atom %.

16 Claims, No Drawings

PHOTOMASK BLANK AND MAKING METHOD, PHOTOMASK, LIGHT PATTERN EXPOSURE METHOD, AND DESIGN METHOD OF TRANSITION METAL/SILICON BASE MATERIAL FILM

CROSS-REFERENCE TO RELATED APPLICATION

This non-provisional application claims priority under 35 U.S.C. §119(a) on Patent Application No. 2010-203252 filed in Japan on Sep. 10, 2010, the entire contents of which are hereby incorporated by reference.

TECHNICAL FIELD

This invention relates to a photomask blank having a transition metal/silicon base material film, a method for preparing the photomask blank, and a photomask prepared from the photomask blank, the photomask being used in the microfabrication of semiconductor integrated circuits. It also relates to a light pattern exposure method using the photomask, and a method for designing a transition metal/silicon base material film for use in the photomask blank and photomask.

BACKGROUND ART

While semiconductor integrated circuits are used in a wide variety of applications, an increasingly finer circuit design is required for such goals as a higher density of integration and a saving of power consumption. In liaison with the demand, the circuit-forming lithography involving exposure through a photomask uses a light source of shorter wavelength in order to produce a finer image. In the advanced lithography process for current use on a commercial basis, the light source for exposure has shifted from KrF excimer laser light (248 nm) to ArF excimer laser light (193 nm).

The lithography using ArF excimer laser light of greater energy was found to cause damages to the mask, which were not found with KrF excimer laser light. One problem is that on continuous use of the photomask, foreign matter-like growth defects form on the photomask. These growth defects are also known as "haze". The source of haze formation was formerly believed to reside in the growth of ammonium sulfate crystals on the mask pattern surface. It is currently believed that organic matter participates in haze formation as well.

Some approaches are known to overcome the haze problem. For example, with respect to the growth defects formed on the photomask upon long-term irradiation of ArF excimer laser light, JP-A 2008-276002 describes that the photomask must be washed at a predetermined stage before the photomask can be continuously used. Also JP-A 2010-156880 discloses that haze formation can be inhibited by oxidative treatment of a surface of a photomask blank.

Nevertheless, as the dose of irradiation of ArF excimer laser light for pattern transfer increases, the photomask is given damages other than haze. It was found that the line width of the mask pattern changes in accordance with the cumulative irradiation energy dose. See Thomas Faure et al., "Characterization of binary mask and attenuated phase shift mask blanks for 32 nm mask fabrication," Proc. of SPIE vol. 7122, pp 712209-1 to 712209-12. This problem is that as the cumulative irradiation energy dose increases during long-term irradiation of ArF excimer laser light, a layer of a substance which is considered to be an oxide of the pattern material grows outside the film pattern, whereby the pattern width changes. It is reported that the mask once damaged cannot be restored by washing with SC-1 (aqueous ammonia/aqueous hydrogen peroxide) as used in the above-mentioned haze removal or with sulfuric acid/aqueous hydrogen peroxide. It is believed that the damage source is utterly different.

The above article points out that upon exposure of a circuit pattern through a halftone phase shift mask which is the mask technology useful in expanding the depth of focus, substantial degradation is induced by pattern size variation resulting from alternation of a transition metal/silicon base material film such as MoSi base material film by irradiation of ArF excimer laser light (this degradation is referred to as "a degradation by shift of pattern size"). Then, in order to use an expensive photomask over a long period of time, it is necessary to address the degradation by shift of pattern size by irradiation of ArF excimer laser light.

Citation List

Patent Document 1: JP-A 2008-276002 (U.S. Pat. No. 7,941,767)

Patent Document 2: JP-A 2010-156880 (US 20100167185, DE 102009060677, KR 20100080413)

Patent Document 3: JP-A H07-140635

Patent Document 4: JP-A H10-171096

Patent Document 5: JP-A 2004-133029

Patent Document 6: JP-A H07-181664

Patent Document 7: JP-A 2007-033470

Patent Document 8: JP-A 2006-078807 (U.S. Pat. No. 7,691,546, EP 1801647)

Non-Patent Document 1: Thomas Faure et al., "Characterization of binary mask and attenuated phase shift mask blanks for 32 nm mask fabrication," Proc. of SPIE vol. 7122, pp 712209-1 to 712209-12

SUMMARY OF INVENTION

An object of the invention is to provide a photomask which upon patternwise exposure to ArF excimer laser light or light of shorter wavelength and greater energy than the conventional light, is minimized in a degradation by shift of pattern size resulting from alternation of film property by light irradiation, even in the case of an increased cumulative irradiation energy dose; a photomask blank from which the photomask is obtained; a method for preparing the photomask blank; a light pattern exposure method using the photomask; and a method for designing a transition metal/silicon base material film for use in the photomask blank and photomask.

As pointed out in Non-Patent Document 1, the degradation by shift of pattern size by irradiation of ArF excimer laser light does scarcely occur when light is irradiated in a dry air atmosphere. The light irradiation in a dry air atmosphere adds an extra unit to the exposure system and gives rise to electrostatic and other problems to be managed, leading to an increased expense. Under the circumstances, the inventors attempted to improve the film material of a photomask so as to enable long-term exposure in a common humid atmosphere.

The photomasks used in the lithography using ArF excimer laser light as light source include halftone phase shift masks which use a transition metal-containing silicon base material, typically a molybdenum-containing silicon base material. This silicon base material is mainly composed of a transition metal and silicon, and further contains oxygen and/or nitrogen as light element (e.g., JP-A H07-140635), or further contains a minute amount of carbon and/or hydrogen (e.g., JP-A H10-171096). Suitable transition metals used include Mo, Zr, Ta, W, and Ti. Among others, Mo is most commonly used (e.g., JP-A H07-140635), and sometimes a second transition metal is added (e.g., JP-A 2004-133029). For the light-shielding film as well, a transition metal-containing silicon base material, typically a molybdenum-containing silicon base material is used.

While the prior art halftone phase shift film uses the aforementioned material to achieve a phase shift of exposure light and a necessary amount of attenuation, it is preferably designed so as to provide the film with a high refractive index by incorporating a certain amount of nitrogen and to acquire optimum optical and chemical properties by adding a necessary amount of oxygen (e.g., JP-A H07-181664). In particular, the film material adapted for ArF excimer laser light is given the required physical properties by incorporating a larger amount of nitrogen than that for KrF excimer laser light, and optionally, adding a relatively small amount of oxygen. Nevertheless, when a photomask using such a material is irradiated with a large dose of high-energy light, the mask undergoes significant degradation by shift of pattern size by irradiation of high-energy light. Then the service lifetime of the photomask is shorter than the requirement.

Then the inventors attempted to develop a transition metal-containing silicon base material (referred to as "transition metal/silicon base material," hereinafter) used as the halftone phase shift film or the like, which when irradiated with ArF excimer laser light in a controlled humid atmosphere which is commonly employed in lithography using a photomask, experiences a minimum of degradation by shift of pattern size resulting from alternation of the transition metal/silicon base material film. With respect to the instability of transition metal/silicon base material caused by light excitation, the inventors formed the following hypothesis. When a transition metal/silicon base material, for example, molybdenum/silicon base material is continuously irradiated with ArF excimer laser light in moist conditions, a nitrogen-containing molybdenum/silicon base material undergoes a chemical change like oxide conversion as a result of nitrogen being liberated. In judging such chemical change susceptibility, the valence of an individual element must be considered. The valence of an element multiplied by its content represents the relative number of bonds of that element in the material. It is believed that the chemical change susceptibility is correlated to the products of elements (product=valence multiplied by content). As long as the transition metal/silicon base material is concerned, this correlation is applicable to not only the halftone phase shift film, but also the light-shielding film and films of other type.

Regarding a mask having a transition metal/silicon base material film containing nitrogen and oxygen, the inventors have found that the size variation degradation of the mask pattern by cumulative irradiation of ArF excimer laser light is correlated to the contents of transition metal and silicon, the contents of transition metal, silicon and nitrogen, or the contents of transition metal, silicon, nitrogen and oxygen and that this correlation is compliant with the above hypothesis. By adjusting the contents of the indicated elements in the transition metal/silicon base material film so as to meet the predetermined relation, the degradation by shift of pattern size by irradiation of ArF excimer laser light is substantially restrained.

In one aspect, the invention provides a photomask blank comprising a transparent substrate and a transition metal/silicon base material film of a material comprising a transition metal, silicon, oxygen and nitrogen, disposed on the substrate.

In a first embodiment, the transition metal/silicon base material film has an oxygen content of at least 3 atom % and is constructed by a layer of a transition metal/silicon base material satisfying the following formula (1):

$$4 \times C_{Si}/100 - 6 \times C_M/100 > 1 \quad (1)$$

wherein $C_{Si}$ is a silicon content in atom % and $C_M$ is a transition metal content in atom %, a multilayer structure having at least two such layers stacked, or a combination of such a layer or a multilayer structure with a surface oxidized layer disposed remote from the substrate and having a thickness of up to 10 nm.

In a second embodiment, the transition metal/silicon base material film has an oxygen content of at least 3 atom % and is constructed by a layer of a transition metal/silicon base material satisfying the following formula (2):

$$4 \times C_{Si}/100 - 6 \times C_M/100 - 3 \times C_N/100 > -0.1 \quad (2)$$

wherein $C_{Si}$ is a silicon content in atom %, $C_M$ is a transition metal content in atom %, and $C_N$ is a nitrogen content in atom %, a multilayer structure having at least two such layers stacked, or a combination of such a layer or a multilayer structure with a surface oxidized layer disposed remote from the substrate and having a thickness of up to 10 nm.

In a third embodiment, the transition metal/silicon base material film has an oxygen content of at least 3 atom % and is constructed by a layer of a transition metal/silicon base material satisfying the following formula (3):

$$4 \times C_{Si}/100 - 6 \times C_M/100 - 3 \times C_N/100 + 2 \times C_O/100 > 0 \quad (3)$$

wherein $C_{Si}$ is a silicon content in atom %, $C_M$ is a transition metal content in atom %, $C_N$ is a nitrogen content in atom %, $C_O$ is an oxygen content in atom %, a multilayer structure having at least two such layers stacked, or a combination of such a layer or a multilayer structure with a surface oxidized layer disposed remote from the substrate and having a thickness of up to 10 nm.

In any of these embodiments, the transition metal is typically molybdenum. The surface oxidized layer is preferably formed by air oxidation or forced oxidative treatment of a sub-surface region of the layer of the transition metal/silicon base material. Typically the transition metal/silicon base material film is a halftone phase shift film. In another aspect, the invention provides a photomask prepared from the photomask blank defined above.

In a further aspect, the invention provides a light pattern exposure method comprising irradiating ArF excimer laser light to an object through the photomask defined above to expose the object to a pattern of light.

In a preferred embodiment, ArF excimer laser light is irradiated through the photomask to expose the object to a pattern of light after the photomask has been irradiated in a cumulative dose of at least 10 kJ/cm².

In connection with a photomask having formed thereon a pattern of a transition metal/silicon base material film of a material comprising a transition metal, silicon, oxygen and nitrogen, the invention further provides a method for designing the transition metal/silicon base material film such that the film pattern may be restrained in pattern line width variation degradation by irradiation of ArF excimer laser light.

In one embodiment, the method comprises the steps of providing the transition metal/silicon base material film with an oxygen content of at least 3 atom %, constructing the transition metal/silicon base material film by a layer of a transition metal/silicon base material, a multilayer structure having at least two such layers stacked, or a combination of such a layer or a multilayer structure with a surface oxidized layer disposed remote from the substrate and having a thickness of up to 10 nm, and selecting a silicon content $C_{Si}$ and a transition metal content $C_M$ of the transition metal/silicon base material so as to satisfy the following formula (1):

$$4 \times C_{Si}/100 - 6 \times C_M/100 > 1 \quad (1)$$

wherein $C_{Si}$ is a silicon content in atom % and $C_M$ is a transition metal content in atom %.

In another embodiment, the method comprises the steps of providing the transition metal/silicon base material film with an oxygen content of at least 3 atom %, constructing the transition metal/silicon base material film by a layer of a transition metal/silicon base material, a multilayer structure having at least two such layers stacked, or a combination of such a layer or a multilayer structure with a surface oxidized layer disposed remote from the substrate and having a thickness of up to 10 nm, and selecting a silicon content $C_{Si}$, a transition metal content $C_M$, and a nitrogen content $C_N$ of the transition metal/silicon base material so as to satisfy the following formula (2):

$$b\ 4 \times C_{Si}/100 - 6 \times C_M/100 - 3 \times C_N/100 > 0.1 \quad (2)$$

wherein $C_{Si}$ is a silicon content in atom %, $C_M$ is a transition metal content in atom %, and $C_N$ is a nitrogen content in atom %.

In a further embodiment, the method comprises the steps of providing the transition metal/silicon base material film with an oxygen content of at least 3 atom %, constructing the transition metal/silicon base material film by a layer of a transition metal/silicon base material, a multilayer structure having at least two such layers stacked, or a combination of such a layer or a multilayer structure with a surface oxidized layer disposed remote from the substrate and having a thickness of up to 10 nm, and selecting a silicon content $C_{Si}$, a transition metal content $C_M$, a nitrogen content $C_N$, and an oxygen content $C_O$ of the transition metal/silicon base material so as to satisfy the following formula (3):

$$4 \times C_{Si}/100 - 6 \times C_M/100 - 3 \times C_N/100 + 2 \times C_O/100 > 0 \quad (3)$$

wherein $C_{Si}$ is a silicon content in atom %, $C_M$ is a transition metal content in atom %, $C_N$ is a nitrogen content in atom %, $C_O$ is an oxygen content in atom %.

In these embodiments, the transition metal is typically molybdenum. The surface oxidized layer is preferably formed by air oxidation or forced oxidative treatment of a sub-surface region of the layer of the transition metal/silicon base material. The transition metal/silicon base material film is typically a halftone phase shift film.

In a still further aspect, the invention provides a method for preparing a photomask blank, comprising the step of depositing a transition metal/silicon base material film as designed by the designing method on a transparent substrate.

Advantageous Effects Of Invention

In a halftone phase shift film or light-shielding film formed of a transition metal/silicon base material, typically MoSi base material, the degradation by shift of pattern size resulting from alternation of the transition metal/silicon base material film by cumulative irradiation of high-energy light, typically ArF excimer laser light is substantially restrained. Even when the cumulative dose of high-energy light irradiated is greater than in the prior art, light pattern exposure by photolithography can be continued without resetting pattern exposure conditions of an exposure system.

DESCRIPTION OF EMBODIMENTS

According to the invention, a photomask blank is defined as comprising a transparent substrate such as quartz substrate and a transition metal/silicon base material film disposed on the substrate, the film being formed of a material comprising a transition metal, silicon, oxygen and nitrogen. The transition metal/silicon base material film is formed as a halftone phase shift film, light-shielding film or the like. In one embodiment wherein the transition metal/silicon base material film is a halftone phase shift film, the film should provide a predetermined phase shift (most often, about 180°) and a predetermined transmittance (most often, 1 to 40%) relative to exposure light, typically ArF excimer laser light. In another embodiment wherein the transition metal/silicon base material film is a light-shielding film, the film alone should have an optical density of at least 2.5 if another light-absorbing film is absent. If another light-absorbing film (e.g., halftone phase shift film or etch resistant film) is present, the film is combined with the other light-absorbing film to provide an overall film having an optical density of at least 2.5.

First Embodiment

The degradation by shift of pattern size of the transition metal/silicon base material film by irradiation of high-energy light, typically ArF excimer laser light depends on the contents of transition metal and silicon. In the first embodiment, the transition metal/silicon base material film has an oxygen content of at least 3 atom % and is constructed by a layer of a transition metal/silicon base material satisfying the following formula (1):

$$4 \times C_{Si}/100 - 6 \times C_M/100 > 1 \quad (1)$$

wherein $C_{Si}$ is a silicon content in atom % and $C_M$ is a transition metal content in atom %, a multilayer structure having at least two such layers stacked, or a combination of such a layer or a multilayer structure with a surface oxidized layer disposed remote from the substrate and having a thickness of up to 10 nm whereby the degradation by shift of pattern size is restrained.

In the transition metal/silicon base material, the transition metal such as molybdenum forms a weaker bond than silicon. If the number of bonds of transition metal is larger than the number of bonds of silicon, then the material is more susceptible to oxidation upon irradiation of high-energy light such as ArF excimer laser light. It is thus believed that the degradation by shift of pattern size is correlated to the number of silicon bonds and the number of transition metal bonds. It is effective for restraining the degradation by shift of pattern size that the transition metal/silicon base material film is designed by applying the above-specified material composition and film construction.

The transition metal forms a weaker bond than silicon. Then, greater values of the left side member of formula (1), i.e., $4 \times C_{Si}/100 - 6 \times C_M/100$ (=A1) are better. A1 corresponds to a value obtained by subtracting the number of transition metal bonds from the number of silicon bonds. The degradation by shift of pattern size is more restrained by setting the value of A1 to be greater than 1. The value of A1 is preferably less than or equal to 3.85 in order that the material be practically effective.

Second Embodiment

The degradation by shift of pattern size of the transition metal/silicon base material film by irradiation of high-energy light, typically ArF excimer laser light depends on the contents of transition metal, silicon, and nitrogen. In the second embodiment, the transition metal/silicon base material film has an oxygen content of at least 3 atom % and is constructed by a layer of a transition metal/silicon base material satisfying the following formula (2):

$$4 \times C_{Si}/100 - 6 \times C_M/100 - 3 \times C_N/100 > -0.1 \quad (2)$$

wherein $C_{Si}$ is a silicon content in atom %, $C_M$ is a transition metal content in atom %, and $C_N$ is a nitrogen content in atom %, a multilayer structure having at least two such layers stacked, or a combination of such a layer or a multilayer structure with a surface oxidized layer disposed remote from the substrate and having a thickness of up to 10 nm whereby the degradation by shift of pattern size is restrained.

In the transition metal/silicon base material, the transition metal such as molybdenum forms a weaker bond than silicon. If the number of bonds of transition metal is larger than the number of bonds of silicon, then the material is more susceptible to oxidation upon irradiation of high-energy light such as ArF excimer laser light. As to the bond of nitrogen, nitride can be a starting substance for degradation reaction. It is thus believed that the degradation by shift of pattern size is correlated to the number of silicon bonds, the number of transition metal bonds, and the number of nitrogen bonds. It is effective for restraining the degradation by shift of pattern size that the transition metal/silicon base material film is designed by applying the above-specified material composition and film construction.

The transition metal forms a weaker bond than silicon. Since nitride is a starting substance for degradation reaction, a smaller number of nitrogen bonds is better. Thus greater values of the left side member of formula (2), i.e., $4 \times C_{Si}/100 - 6 \times C_M/100 - 3 \times C_N/100$ (=A2) are better. A2 corresponds to a value obtained by subtracting the number of transition metal bonds and nitrogen bonds from the number of silicon bonds. The degradation by shift of pattern size is more restrained by setting the value of A2 to be greater than −0.1. The value of A2 is preferably less than or equal to 3.85 in order that the material be practically effective.

Third Embodiment

The degradation by shift of pattern size of the transition metal/silicon base material film by irradiation of high-energy light, typically ArF excimer laser light depends on the contents of transition metal, silicon, nitrogen, and oxygen. In the third embodiment, the transition metal/silicon base material film has an oxygen content of at least 3 atom % and is constructed by a layer of a transition metal/silicon base material satisfying the following formula (3):

$$4 \times C_{Si}/100 - 6 \times C_M/100 - 3 \times C_N/100 + 2 \times C_O/100 > 0 \quad (3)$$

wherein $C_{Si}$ is a silicon content in atom %, $C_M$ is a transition metal content in atom %, $C_N$ is a nitrogen content in atom %, and $C_O$ is an oxygen content in atom %, a multilayer structure having at least two such layers stacked, or a combination of such a layer or a multilayer structure with a surface oxidized layer disposed remote from the substrate and having a thickness of up to 10 nm whereby the degradation by shift of pattern size is restrained.

In the transition metal/silicon base material, the transition metal such as molybdenum forms a weaker bond than silicon. If the number of bonds of transition metal is larger than the number of bonds of silicon, then the material is more susceptible to oxidation upon irradiation of high-energy light such as ArF excimer laser light. As to the bond of nitrogen, nitride can be a starting substance for degradation reaction. Since oxide is a final substance of degradation reaction, oxygen is an inhibitory factor to degradation reaction. It is thus believed that the degradation by shift of pattern size is correlated to the number of silicon bonds, the number of transition metal bonds, and the number of nitrogen bonds, and the number of oxygen bonds. It is effective for restraining the degradation by shift of pattern size that the transition metal/silicon base material film is designed by applying the above-specified material composition and film construction.

The transition metal forms a weaker bond than silicon. Since nitride is a starting substance for degradation reaction, a smaller number of nitrogen bonds is better. Since oxygen is an inhibitory factor to degradation reaction, a more number of oxygen bonds is better. Thus greater values of the left side member of formula (3), i.e., $4 \times C_{Si}/100 - 6 \times C_M/100 - 3 \times C_N/100 + 2 \times C_O/100$ (=A3) are better. A3 corresponds to a value obtained by subtracting the number of transition metal bonds and nitrogen bonds from the number of silicon bonds and oxygen bonds. The degradation by shift of pattern size is more inhibited by setting the value of A3 to be greater than 0. The value of A3 is preferably less than or equal to 3.9 in order that the material be practically effective.

The following description commonly applies to the foregoing first, second and third embodiments.

As used herein, the term "multilayer structure" encompasses a compositionally graded film, that is, a film whose composition continuously varies in a thickness direction.

A surface of transition metal/silicon base material may be subject to oxidation by the ambient air. Then an outermost surface region of a transition metal/silicon base material film may have a high degree of oxidation. Sometimes, an outermost surface region of a transition metal/silicon base material film is forcedly subjected to oxidative treatment in order to endow it with chemical resistance upon cleaning or resistance to oxidation in air. Therefore, the transition metal/silicon base material film may be constructed by a single layer of the transition metal/silicon base material satisfying any one of formulae (1) to (3), or a multilayer structure having at least two such layers stacked, or a combination of such a layer or a multilayer structure with a surface oxidized layer disposed remote from the substrate and having a thickness of up to 10 nm.

The transition metal/silicon base material of which the layer or layers of the transition metal/silicon base material film except for the surface oxidized layer are formed should satisfy the formula. As long as the transition metal/silicon base material of which the layer or layers of the transition metal/silicon base material film are formed is formulated in this way, the degradation by shift of pattern size is restrained even when high-energy light (or short-wavelength light) such as ArF excimer laser light is irradiated for a long period of time, or differently stated, even when the cumulative irradiation dose is increased.

In the process to be employed in the future for light pattern exposure through a photomask, the photomask is required, from the standpoint of economy in the, immersion lithography or the like, to satisfy that the size variation of the mask pattern is below the permissible level as long as the cumulative irradiation energy dose is less than about 10 kJ/cm². For the 22 nm pattern rule, the permissible level is of the order of ±5 nm. If the transition metal/silicon base material of which the layer of the transition metal/silicon base material film is formed meets the specific formula, the resulting transition metal/silicon base material film can accommodate the requirement.

In the embodiment wherein the transition metal/silicon base material film is designed as a halftone phase shift film providing a phase shift of about 180°, the halftone phase shift film as a whole may have an appropriate thickness in the range of 50 to 150 nm, more preferably 60 to 90 nm. When a high light absorptive layer and a low light absorptive layer are combined to construct a structure consisting of uniform composition layers, it is preferred that the high light absorptive layer have a thickness of 1 to 30 nm, especially 5 to 20 nm and the low light absorptive layer have a thickness of 30 to 120 nm, especially 40 to 70 nm. In the case of such multilayer structure, it is preferred for improved chemical resistance that the high light absorptive layer be disposed closer to the transparent substrate, and for improved adhesion that the low light absorptive layer be disposed on the substrate. To improve the detection sensitivity to inspection wavelength, this embodiment may also take the form of a three-layer structure in which a low light absorptive layer is sandwiched between two high light absorptive layers, or a four or multilayer structure in which high light absorptive layers and low light absorptive layers are alternately stacked in order on the transparent substrate.

In the other embodiment wherein the transition metal/silicon base material film is designed as a light shielding film, the light-shielding film has such a thickness that the total of films formed on the transparent substrate to construct a photomask may have an optical density of at least 2.5, and specifically, an appropriate thickness in the range of 10 to 200 nm, more preferably 10 to 70 nm. In general, the light-shielding film is preferably constructed as further comprising an antireflective layer on the surface side and/or the substrate side. This antireflective layer is preferably made of a material similar to the transition metal/silicon base material defined herein, for example, a transition metal/silicon oxide, transition metal/silicon nitride, transition metal/silicon oxynitride or the like, because the antireflective layer can be etched under the same conditions as the light-shielding film. More preferably the antireflective layer is made of a material of the composition satisfying any one of formulae (1) to (3). It is also acceptable to deposit on the light-shielding film a hard mask film which will serve as a mask in forming a pattern of the light-shielding film.

Preferred examples of the material containing transition metal, silicon, oxygen and nitrogen of which the transition metal/silicon base material film is formed include transition metal/silicon oxynitride and transition metal/silicon oxide nitride carbide. It suffices that the transition metal/silicon base material film as a whole contains transition metal, silicon, oxygen and nitrogen.

On the other hand, preferred examples of the transition metal/silicon base material of each layer of the transition metal/silicon base material film include transition metal/silicon oxynitride, transition metal/silicon oxide nitride carbide, and the like. In the case of multilayer structure, some layers may be made of such a material as transition metal/silicon oxide, transition metal/silicon nitride, transition metal/silicon carbide, transition metal/silicon oxycarbide, transition metal/silicon nitride carbide or the like. Further, transition metal silicide may be used when a strong light absorption function is desired.

The transition metal is preferably at least one element selected from among titanium, vanadium, cobalt, nickel, zirconium, niobium, molybdenum, hafnium, tantalum, and tungsten. Of these, molybdenum is most preferred from the standpoint of dry etching. The content of transition metal is discussed first. If the transition metal content is high, the contents of other elements are relatively low, making it difficult to adjust the compositional ratio of respective elements so as to meet the required optical properties including refractive index and transmittance. Then in the transition metal/silicon base material film except for the surface oxidized layer, the transition metal content is preferably from more than 0 atom % to 30 atom %, more preferably from 1 atom % to 20 atom %, and even more preferably from 1 atom % to 15 atom %. Also in the transition metal/silicon base material film except for the surface oxidized layer, the silicon content is preferably from 30 atom % to 85 atom %, more preferably from 35 atom % to 70 atom %.

In the transition metal/silicon base material film except for the surface oxidized layer, the oxygen content is preferably at least 3 atom %, more preferably at least 5 atom %. The upper limit of the oxygen content is generally up to 60 atom %. An embodiment is considered wherein the transition metal/silicon base material film is a halftone phase shift film, and the transition metal/silicon base material film excluding the surface oxidized layer is a single layer or a multilayer structure in which one or more high light absorptive layer is combined with one or more low light absorptive layer. In the prior art, the single layer or the high light absorptive layer is formed of a material containing nitrogen in a high content and having a low content of oxygen added. In contrast, the desired transmittance is obtained according to the invention by keeping the nitrogen content low and increasing the oxygen content. Then the single layer or high light absorptive layer should preferably have an oxygen content of at least 5 atom %, more preferably at least 8 atom %, and even more preferably at least 10 atom %. As compared with nitrogen, oxygen attains an outstanding improvement in transmittance by increasing its content.

In a certain case, a light-shielding film or processing aid film of chromium base material is formed on the transition metal/silicon base material film. The transition metal/silicon base material film preferably has resistance to chlorine dry etching conditions employed in etching of the chromium base material film. To this end, the transition metal/silicon base material film excluding the surface oxidized layer should preferably have a nitrogen content of at least 5 atom %, more preferably at least 10 atom %. The upper limit of the nitrogen content is generally up to 57 atom %.

The transition metal/silicon base material of the transition metal/silicon base material film may further contain carbon and hydrogen in low contents. The content of such an element is preferably up to 5 atom % and more preferably should not exceed the impurity level.

The transition metal/silicon base material film may be deposited by well-known techniques. Among others, the sputtering technique is preferred because a film featuring homogeneity is readily deposited. The sputtering technique may be either DC sputtering or RF sputtering.

A choice of target and sputtering gas depends on the layer construction and composition. The target may be a single target in which a ratio of silicon to transition metal is adjusted appropriate or a combination of targets selected from a silicon target, a transition metal target, and a silicon/transition metal target. Where plural targets are used, the ratio of silicon to transition metal may be controlled by adjusting the sputtering area of an individual target or by adjusting the power applied to an individual target. Particularly when a multilayer structure is constructed by combining a high light absorptive layer with a low light absorptive layer, the content of transition metal in the high light absorptive layer and the low light absorptive layer may be independently changed by the above-described method. If the low light absorptive layer has a low transition metal content, then the contents of the remaining elements may be readily set so as to meet the desired optical properties.

A ratio of oxygen and nitrogen contents may be adjusted by effecting reactive sputtering using oxygen-containing gas and nitrogen-containing gas as the reactive sputtering gas while adjusting the flow rates of these gases. This is true when other light elements such as carbon and hydrogen are added. Examples of the reactive gas used herein include oxygen gas, nitrogen gas, nitrogen oxide gas, carbon oxide gas, hydrocarbon gas, hydrogen gas, and the like. In addition, an inert gas such as helium gas, neon gas or argon gas may be used.

The means for forming the surface oxidized layer include air oxidation or atmospheric oxidation and forced oxidative treatment. The forced oxidative treatment of a transition metal/silicon base material film may be performed, for example, by treating with ozone gas or ozone water, or by heating at a temperature of about 300° C. such as oven heating in an oxygen-containing atmosphere, lamp annealing, and laser heating. The surface oxidized layer has a thickness of up to 10 nm, and a thickness of at least 1 nm is sufficient to be effective as an oxide layer. The surface oxidized layer having a thickness of this order has no substantial impact on the degradation by shift of pattern size by irradiation of ArF excimer laser light. Although the surface oxidized layer may be formed by increasing the flow rate of oxygen during the sputtering process, it is preferably formed by the above-mentioned air oxidation or forced oxidative treatment because the layer formed thereby contains less defects.

In the embodiment wherein the photomask blank is a halftone phase shift mask blank, like conventional halftone phase shift mask blanks, a light-shielding film may be formed on the halftone phase shift film in order to provide a full light shielding region thereon. Although the light-shielding film may be made of any desired materials, a film of chromium base material which can be also utilized as an auxiliary film for etching process is preferred. With respect to the construction and composition of the light-shielding film, a number of reports are known. Preferably the light-shielding film is constructed by forming a Cr base light-shielding film, and further depositing thereon a Cr base antireflective film for reducing reflection from the light-shielding film. The light-shielding film and antireflective film each may be a single layer or a multilayer structure. The materials for the Cr base light-shielding film and antireflective film include chromium alone, chromium oxide (CrO), chromium nitride (CrN), chromium carbide (CrC), chromium oxynitride (CrON), chromium oxycarbide (CrOC), chromium nitride carbide (CrNC), and chromium oxide nitride carbide (CrONC).

The Cr base light-shielding film and antireflective film may be deposited by reactive sputtering. The reactive sputtering process uses a target of chromium alone or a target of chromium having one or more of oxygen, nitrogen and carbon added thereto. The sputtering gas is an inert gas such as Ar, He, Ne or Kr, to which a gas selected from oxygen-containing gas, nitrogen-containing gas and carbon-containing gas in accordance with the desired composition of a film being deposited is added.

The halftone phase shift mask blank may be processed into a halftone phase shift mask by a standard technique. For example, a halftone phase shift mask blank comprising a halftone phase shift film and a light-shielding film or antireflective film of chromium base material deposited thereon may be processed as follows.

First, a resist film adapted for electron beam (EB) lithography is formed on the halftone phase shift mask blank, exposed to a pattern of EB, and developed in a conventional way, forming a resist pattern. While the resist pattern thus obtained is used as etching mask, oxygen-containing chlorine base dry etching is carried out for transferring the resist pattern to the chromium base material film. While the chromium base material film pattern is used as etching mask, fluorine base dry etching is carried out for transferring the pattern to the halftone phase shift film. If any region of the chromium base material film is to be left as a light-shielding film, a resist pattern for protecting that region is formed. Thereafter, the unnecessary chromium base material film is stripped off by oxygen-containing chlorine base dry etching again. The resist material is removed in a conventional manner, yielding a halftone phase shift mask.

When a photomask blank has a transition metal/silicon base material film formed as a light-shielding film, a photomask may be prepared from the blank by a conventional method.

The light pattern exposure method of the invention is defined as comprising irradiating ArF excimer laser light to an object through the photomask to expose the object to a pattern of light. Specifically, light pattern exposure is performed by using the photomask, irradiating ArF excimer laser light to the transition metal/silicon base material film pattern thereon, with light being transmitted by the region where the transition metal/silicon base material film pattern is absent, and exposing the object to the pattern of transmitted light. The method of the invention is effective for the exposure method where irradiation of high-energy light is applied, for example, the exposure method using ArF excimer laser light as the light source. The irradiation of ArF excimer laser light may be either dry lithography or immersion lithography. The invention is useful particularly when a wafer of at least 300 mm as a work to be processed is exposed to a pattern of light by the immersion lithography with the tendency that a cumulative irradiation energy dose increases within a relatively short time in commercial scale microfabrication.

It is a serious problem that when a mask pattern of a transition metal/silicon base material film is irradiated with high-energy light, the mask pattern for exposure experiences a variation of line width. The permissible threshold of pattern width differs with the mask pattern, especially the pattern rule applied thereto. If variations are small, the mask may be further used by correcting the conditions and resetting the irradiation conditions of an exposure system. However, in the lithography for forming semiconductor circuits complying with the pattern rule of 22 nm, the variation of mask pattern line width must fall within approximately ±5 nm. When the photomask of the invention is used, the degradation by shift of pattern size by irradiation of light is substantially nil as long as the cumulative irradiation energy dose is less than 10 kJ/cm$^2$. Even when the cumulative irradiation energy dose exceeds 10 kJ/cm$^2$, the degradation by shift of pattern size by irradiation of light is minimal, allowing the light pattern exposure to be continued without resetting the transfer conditions.

EXAMPLE

Examples are given below for further illustrating the invention although the invention is not limited thereto.

Exampled 1 to 7 and Comparative Example 1

A DC sputtering system was loaded with two targets, a MoSi$_2$ target and a Si target, and Ar gas, O$_2$ gas and N$_2$ gas were fed thereto as sputtering gas. While a quartz substrate was spun at 30 rpm, a single layer consisting of molybdenum, silicon, nitrogen and oxygen was deposited on the substrate to form a transition metal/silicon base material film of about 70 nm thick. The composition of the transition metal/silicon base material film was analyzed by ESCA, with the results shown in Table 1.

TABLE 1

|  | Mo (at %) | Si (at %) | N (at %) | O (at %) |
| --- | --- | --- | --- | --- |
| Example 1 | 5 | 42 | 35 | 18 |
| Example 2 | 4 | 47 | 41 | 8 |
| Example 3 | 6 | 46 | 39 | 9 |
| Example 4 | 11 | 45 | 39 | 5 |

TABLE 1-continued

|  | Mo (at %) | Si (at %) | N (at %) | O (at %) |
|---|---|---|---|---|
| Example 5 | 4 | 40 | 42 | 14 |
| Example 6 | 9 | 46 | 40 | 5 |
| Example 7 | 5 | 43 | 39 | 13 |
| Comparative Example 1 | 11 | 37 | 40 | 12 |

Next, on the transition metal/silicon base material film, a light-shielding film of chromium base material was deposited using a Cr target and sputtering gases. Specifically, a CrON layer of 20 nm thick was deposited by feeding Ar, $N_2$ and $O_2$ gases in a flow rate ratio of Ar:$N_2$:$O_2$=1:2:1, a Cr layer of 7 nm thick was deposited by feeding only Ar gas, and a CrON layer of 20 nm thick was deposited by feeding Ar, $N_2$ and $O_2$ gases in a flow rate ratio of Ar:$N_2$:$O_2$=1:2:1. In this way, a light-shielding film of chromium base material having a total thickness of 47 nm was formed.

Next, a positive resist film for EB lithography was formed on the light-shielding film. The resist film was exposed to a pattern of EB, forming an iso-line, iso-space, line-and-space model pattern having a line width of 0.1 to 2 μm.

With the resist pattern made etching mask, the light-shielding film was etched with chlorine base etchant.

Then the transition metal/silicon base material film was dry etched with fluorine base etchant. Finally the light-shielding film was removed by chlorine base etching, yielding a photomask having a pattern of the transition metal/silicon base material film.

In an environment of 23° C. and humidity 40%, the photomask thus obtained was irradiated with ArF excimer laser light having a pulse width of 200 Hz and a pulse energy of 50 to 200 mJ until the cumulative irradiation energy dose reached 30 kJ/cm². An exposure system ArFES-3500PM (Litho Tech Japan Corp.) and a light source LPX Pro220 (Coherent GmbH) were used.

The size of the pattern of transition metal/silicon base material film was measured under a scanning electron microscope LWM9045 (Vistec) to determine how the pattern size shifted when the pattern was irradiated with ArF excimer laser light. It was observed that the line width increased in a similar manner independent of the type and size of the pattern. For patterns of different type and line width, changes (increases) of line width were averaged. The average was expressed in a relative value provided that the average change (19 nm) of Comparative Example 1 is 1. Also a change corresponding to a cumulative irradiation dose of 10 kJ/cm² was computed from the measured change. These data are shown in Table 2. Herein, a line width change after a cumulative irradiation dose of 30 kJ/cm² was measured for the purpose of increasing the measurement accuracy of line width changes. Since the line width change is proportional to the irradiation dose, the change after a cumulative irradiation dose of 10 kJ/cm² corresponds to ⅓ of the cumulative irradiation dose of 30 kJ/cm².

Also, values of A1, A2 and A3 of the following equations were computed, with the data shown in Table 2.

$$A1 = 4 \times C_{Si}/100 - 6 \times C_M/100$$

$$A2 = 4 \times C_{Si}/100 - 6 \times C_M/100 - 3 \times C_N/100$$

$$A3 = 4 \times C_{Si}/100 - 6 \times C_M/100 - 3 \times C_N/100 + 2 \times C_O/100$$

Herein, $C_{Si}$ is a silicon content in atom %, $C_M$ is a transition metal content in atom %, $C_N$ is a nitrogen content in atom %, $C_O$ is an oxygen content in atom %.

TABLE 2

|  | Formula (1) A1 | Formula (2) A2 | Formula (3) A3 | Line width change Cumulative dose 30 kJ/cm² (relative value) | Line width change Cumulative dose 10 kJ/cm² equivalent (nm) |
|---|---|---|---|---|---|
| Example 1 | 1.4 | 0.33 | 0.69 | 0.4 | 3 |
| Example 2 | 1.6 | 0.41 | 0.57 | 0.1 | 1 |
| Example 3 | 1.5 | 0.31 | 0.49 | 0.3 | 2 |
| Example 4 | 1.1 | −0.03 | 0.07 | 0.4 | 3 |
| Example 5 | 1.4 | 0.10 | 0.38 | 0.3 | 2 |
| Example 6 | 1.3 | 0.10 | 0.20 | 0.3 | 2 |
| Example 7 | 1.4 | 0.25 | 0.51 | 0.3 | 2 |
| Comparative Example 1 | 0.8 | −0.38 | −0.14 | 1 | 6 |

As is evident from Table 2, the transition metal/silicon base material films of Examples that meet the formula (1), (2) or (3) experienced minimal variations of the pattern size upon exposure to ArF excimer laser light, and specifically, a line width change of less than 5 nm upon exposure in a cumulative irradiation dose of 10 kJ/cm². By contrast, the transition metal/silicon base material film of Comparative Example 1 experienced a substantial change of the pattern size upon exposure to ArF excimer laser light.

Japanese Patent Application No. 2010-203252 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A photomask blank comprising a transparent substrate and a transition metal/silicon base material film of a material comprising a transition metal, silicon, oxygen and nitrogen, disposed on the substrate, wherein
said transition metal/silicon base material film has an oxygen content of at least 3 atom % and is constructed by a layer of a transition metal/silicon base material satisfying the following formula (1):

$$4 \times C_{Si}/100 - 6 \times C_M/100 > 1 \qquad (1)$$

wherein $C_{Si}$ is a silicon content in atom % and $C_M$ is a transition metal content in atom %, a multilayer structure having at least two such layers stacked, or a combination of such a layer or a multilayer structure with a surface oxidized layer disposed remote from the substrate and having a thickness of up to 10 nm.

2. A photomask blank comprising a transparent substrate and a transition metal/silicon base material film of a material comprising a transition metal, silicon, oxygen and nitrogen, disposed on the substrate, wherein
said transition metal/silicon base material film has an oxygen content of at least 3 atom % and is constructed by a layer of a transition metal/silicon base material satisfying the following formula (2):

$$4 \times C_{Si}/100 - 6 \times C_M/100 - 3 \times C_N/100 > -0.1 \qquad (2)$$

wherein $C_{Si}$ is a silicon content in atom %, $C_M$ is a transition metal content in atom %, and $C_N$ is a nitrogen content in atom %, a multilayer structure having at least two such layers stacked, or a combination of such a layer or a multilayer structure with a surface oxidized layer disposed remote from the substrate and having a thickness of up to 10 nm.

3. A photomask blank comprising a transparent substrate and a transition metal/silicon base material film of a material comprising a transition metal, silicon, oxygen and nitrogen, disposed on the substrate, wherein said transition metal/silicon base material film has an oxygen content of at least 3 atom % and is constructed by a layer of a transition metal/silicon base material satisfying the following formula (3):

$$4 \times C_{Si}/100 - 6 \times C_M/100 - 3 \times C_N/100 + 2 \times C_O/100 > 0 \quad (3)$$

wherein $C_{Si}$ is a silicon content in atom %, $C_M$ is a transition metal content in atom %, $C_N$ is a nitrogen content in atom %, $C_O$ is an oxygen content in atom %, a multilayer structure having at least two such layers stacked, or a combination of such a layer or a multilayer structure with a surface oxidized layer disposed remote from the substrate and having a thickness of up to 10 nm.

4. The photomask blank of any one of claims 1 to 3 wherein the transition metal is molybdenum.

5. The photomask blank of any one of claims 1 to 3 wherein the surface oxidized layer is formed by air oxidation or forced oxidative treatment of a sub-surface region of the layer of the transition metal/silicon base material.

6. The photomask blank of any one of claims 1 to 3 wherein said transition metal/silicon base material film is a halftone phase shift film.

7. A photomask prepared from the photomask blank of any one of claims 1 to 3.

8. A light pattern exposure method comprising irradiating ArF excimer laser light to an object through the photomask of claim 7 to expose the object to a pattern of light.

9. The light pattern exposure method of claim 8 wherein ArF excimer laser light is irradiated through the photomask to expose the object to a pattern of light after the photomask has been irradiated in a cumulative dose of at least 10 kJ/cm².

10. In connection with a photomask having formed thereon a pattern of a transition metal/silicon base material film of a material comprising a transition metal, silicon, oxygen and nitrogen, a method for designing the transition metal/silicon base material film such that the film pattern may be restrained in pattern line width variation degradation by irradiation of ArF excimer laser light, the method comprising the steps of:

providing the transition metal/silicon base material film with an oxygen content of at least 3 atom %, constructing the transition metal/silicon base material film by a layer of a transition metal/silicon base material, a multilayer structure having at least two such layers stacked, or a combination of such a layer or a multilayer structure with a surface oxidized layer disposed remote from the substrate and having a thickness of up to 10 nm, and selecting a silicon content $C_{Si}$ and a transition metal content $C_M$ of the transition metal/silicon base material so as to satisfy the following formula (1):

$$4 \times C_{Si}/100 - 6 \times C_M/100 > 1 \quad (1)$$

wherein $C_{Si}$ is a silicon content in atom % and $C_M$ is a transition metal content in atom %.

11. In connection with a photomask having formed thereon a pattern of a transition metal/silicon base material film of a material comprising a transition metal, silicon, oxygen and nitrogen, a method for designing the transition metal/silicon base material film such that the film pattern may be restrained in pattern line width variation degradation by irradiation of ArF excimer laser light, the method comprising the steps of:

providing the transition metal/silicon base material film with an oxygen content of at least 3 atom %, constructing the transition metal/silicon base material film by a layer of a transition metal/silicon base material, a multilayer structure having at least two such layers stacked, or a combination of such a layer or a multilayer structure with a surface oxidized layer disposed remote from the substrate and having a thickness of up to 10 nm, and selecting a silicon content $C_{Si}$, a transition metal content $C_M$, and a nitrogen content $C_N$ of the transition metal/silicon base material so as to satisfy the following formula (2):

$$4 \times C_{Si}/100 - 6 \times C_M/100 - 3 \times C_N/100 > -0.1 \quad (2)$$

wherein $C_{Si}$ is a silicon content in atom %, $C_M$ is a transition metal content in atom %, and $C_N$ is a nitrogen content in atom %.

12. In connection with a photomask having formed thereon a pattern of a transition metal/silicon base material film of a material comprising a transition metal, silicon, oxygen and nitrogen, a method for designing the transition metal/silicon base material film such that the film pattern may be restrained in pattern line width variation degradation by irradiation of ArF excimer laser light, the method comprising the steps of:

providing the transition metal/silicon base material film with an oxygen content of at least 3 atom %, constructing the transition metal/silicon base material film by a layer of a transition metal/silicon base material, a multilayer structure having at least two such layers stacked, or a combination of such a layer or a multilayer structure with a surface oxidized layer disposed remote from the substrate and having a thickness of up to 10 nm, and selecting a silicon content $C_{Si}$, a transition metal content $C_M$, a nitrogen content $C_N$, and an oxygen content $C_O$ of the transition metal/silicon base material so as to satisfy the following formula (3):

$$4 \times C_{Si}/100 - 6 \times C_M/100 - 3 \times C_N/100 + 2 \times C_O/100 > 0 \quad (3)$$

wherein $C_{Si}$ is a silicon content in atom %, $C_M$ is a transition metal content in atom %, $C_N$ is a nitrogen content in atom %, $C_O$ is an oxygen content in atom %.

13. The designing method of any one of claims 10 to 12 wherein the transition metal is molybdenum.

14. The designing method of any one of claims 10 to 12 wherein the surface oxidized layer is formed by air oxidation or forced oxidative treatment of a sub-surface region of the layer of the transition metal/silicon base material.

15. The designing method of any one of claims 10 to 12 wherein said transition metal/silicon base material film is a halftone phase shift film.

16. A method for preparing a photomask blank, comprising the step of depositing a transition metal/silicon base material film as designed by the designing method of any one of claims 10 to 12 on a transparent substrate.

* * * * *